(12) United States Patent
Ryu et al.

(10) Patent No.: US 10,498,057 B2
(45) Date of Patent: Dec. 3, 2019

(54) CLIP-TYPE CONTACTOR AND PROTECTIVE APPARATUS INCLUDING SAME

(71) Applicant: AMOTECH CO., LTD., Incheon (KR)

(72) Inventors: Jae Su Ryu, Seoul (KR); Byung Guk Lim, Incheon (KR); Yun Suk Choi, Incheon (KR); Yoon-Ho Hwang, Seoul (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 16/075,379

(22) PCT Filed: Feb. 6, 2017

(86) PCT No.: PCT/KR2017/001272
§ 371 (c)(1),
(2) Date: Aug. 3, 2018

(87) PCT Pub. No.: WO2017/135781
PCT Pub. Date: Aug. 10, 2017

(65) Prior Publication Data
US 2019/0058271 A1    Feb. 21, 2019

(30) Foreign Application Priority Data

Feb. 4, 2016    (KR) .................. 10-2016-0014447

(51) Int. Cl.
*H01R 12/00*    (2006.01)
*H01R 12/71*    (2011.01)
(Continued)

(52) U.S. Cl.
CPC ........... *H01R 12/714* (2013.01); *H01R 12/57* (2013.01); *H01R 12/7064* (2013.01);
(Continued)

(58) Field of Classification Search
CPC .... H01R 12/57; H01R 12/714; H01R 12/718; H01R 12/7064; H01R 13/24;
(Continued)

(56) References Cited

U.S. PATENT DOCUMENTS 4,012,094 A * 3/1977 VanRenssen ........... H01J 29/92
439/58
4,159,505 A * 6/1979 Carp .................... H05K 3/3405
361/752
(Continued)

FOREIGN PATENT DOCUMENTS

KR    101585604    1/1916
KR    20070109332   11/2007
(Continued)

OTHER PUBLICATIONS

International Search Report and Written Opinion issued in International Patent Application No. PCT/KR2017/001272, dated May 18, 2017.

*Primary Examiner* — Tho D Ta
*Assistant Examiner* — Vladimir Imas
(74) *Attorney, Agent, or Firm* — Norton Rose Fulbright US LLP

(57) ABSTRACT

A clip-type contactor and a protective apparatus including the same are provided. A clip-type contactor according to an embodiment of the present invention includes a bent-shaped body having an elastic force and configured to come into electric contact with a conductor of an electronic device; an elastic restriction part configured to extend from an upper side of the bent-shaped body to a lower side of the bent-shaped body to restrict movement of the body; and a stacking means disposed at a lower portion of the body to be (Continued)

stacked in the same space as that of a functional element configured to protect a user or an inner circuit on a circuit board.

14 Claims, 11 Drawing Sheets

(51) Int. Cl.
    *H01R 12/57*       (2011.01)
    *H01R 13/24*       (2006.01)
    *H01R 12/70*       (2011.01)
    *H05K 1/18*        (2006.01)
    *H05K 9/00*       (2006.01)

(52) U.S. Cl.
    CPC ............ *H01R 12/718* (2013.01); *H01R 13/24* (2013.01); *H01R 13/2478* (2013.01); *H05K 1/181* (2013.01); *H05K 1/183* (2013.01); *H05K 9/0016* (2013.01); *H05K 2201/1053* (2013.01); *H05K 2201/10174* (2013.01); *H05K 2201/10196* (2013.01); *H05K 2201/10295* (2013.01); *H05K 2201/10515* (2013.01)

(58) Field of Classification Search
    CPC .... H01R 13/2478; H05K 1/181; H05K 1/183; H05K 9/0016; H05K 2201/10174; H05K 2201/10196; H05K 2201/10295; H05K 2201/10515; H05K 2201/1053
    USPC .......................................................... 439/81
    See application file for complete search history.

(56) References Cited

U.S. PATENT DOCUMENTS

| | | | | |
|---|---|---|---|---|
| 5,980,268 A | * | 11/1999 | Mischenko | H01M 2/20 439/66 |
| 5,980,335 A | * | 11/1999 | Barbieri | H01R 13/03 439/824 |
| 5,984,693 A | * | 11/1999 | McHugh | H05K 7/1069 439/515 |
| 6,162,103 A | * | 12/2000 | Ono | H01R 13/2421 439/700 |
| 6,280,258 B1 | * | 8/2001 | Frohlund | H04M 1/0216 439/700 |
| 6,293,805 B1 | * | 9/2001 | Wu | G06K 7/0021 439/66 |
| 6,293,806 B1 | * | 9/2001 | Yu | H01R 13/2435 439/66 |
| 6,625,881 B2 | * | 9/2003 | Ammar | H01R 12/714 29/830 |
| 6,814,587 B2 | * | 11/2004 | Ma | H01R 9/096 439/66 |
| 6,913,469 B2 | * | 7/2005 | Chiang | H01R 9/096 439/66 |
| 6,921,270 B2 | * | 7/2005 | Mendenhall | H01R 13/2435 439/66 |
| 7,048,549 B1 | * | 5/2006 | Swain | H01R 13/2435 439/591 |
| 8,011,939 B2 | * | 9/2011 | Braem | H01R 13/2407 439/188 |
| 8,690,585 B2 | * | 4/2014 | An | H01R 13/41 439/66 |
| 9,614,313 B2 | * | 4/2017 | Mikawa | H01R 12/714 |
| 9,705,242 B1 | * | 7/2017 | Heiskanen | H01R 13/6205 |
| 9,853,377 B2 | * | 12/2017 | Kim | H05K 1/02 |
| 9,954,299 B2 | * | 4/2018 | Kiryu | H01R 13/2428 |
| 2015/0062847 A1 | | 3/2015 | Park | |

FOREIGN PATENT DOCUMENTS

| | | |
|---|---|---|
| KR | 10-1001673 | 12/2010 |
| KR | 101088215 | 11/2011 |
| KR | 20130026735 | 3/2013 |
| KR | 101556936 | 10/2015 |

* cited by examiner

US 10,498,057 B2

CLIP-TYPE CONTACTOR AND PROTECTIVE APPARATUS INCLUDING SAME

CROSS-REFERENCE TO RELATED APPLICATIONS

This application is a national phase application under 35 U.S.C. § 371 of International Application No. PCT/KR2017/001272, filed Feb. 6, 2017, which claims priority to and the benefit of Korean Patent Application No. 10-2016-0014447, filed Feb. 4, 2016. The contents of the referenced patent applications are incorporated into the present application by reference.

FIELD OF THE DISCLOSURE

The present invention relates to a clip-type contactor and a protective apparatus including the same, and more specifically, to a clip-type contactor configured to minimize a space occupied when stacked with a functional element on a circuit board and a protective apparatus including the same.

DESCRIPTION OF RELATED ART

A recent portable electronic device has various component elements densely disposed therein due to minimization and multi-functionalization. Accordingly, a conductive gasket is used between an external housing and a mounted circuit board of the portable electronic device to relieve shock from the outside and reduce electromagnetic waves which penetrate into the portable electronic device or leak from the portable electronic device.

Further, the portable electronic device may include a plurality of antennas according to each function due to the multi-functionalization, and at least some of the antennas may be disposed on the external housing of the portable electronic device as a built-in antenna. Accordingly, a conductive contactor is used for electric contact between the antennas disposed on the external housing and the mounted circuit board of the portable electronic device.

In addition, adoption of a housing made of metal material for the portable electronic device has recently increased in order to improve aesthetics and strength.

Accordingly, an electric path may be formed between the external housing and the mounted circuit board by the conductive gasket or the conductive contactor, and, particularly, since the metal housing and the circuit board forms a loop, when static electricity with an instantaneous high voltage is introduced through a conductor such as the metal housing, of which an outwardly exposed area is large, the static electricity may be introduced into the mounted circuit board through the conductive gasket or the conductive contactor to damage a circuit such as an integrated circuit (IC), etc.

Meanwhile, the above-described portable electronic device generally uses a charger to charge a battery. The charger rectifies external alternating current (AC) power to direct current (DC) power, and then converts the DC power once more to lower DC power suitable for the portable electronic device through a transformer. Here, a Y-capacitor (Y-CAP) including a capacitor is provided on each of both ends of the transformer to strengthen the electric insulation properties of the transformer.

However, like unauthentic chargers or the like, when the Y-CAP does not have a regular characteristic, the DC power may not be sufficiently blocked by the Y-CAP. Further, leaking current may be generated by the AC power, and the leaking current may be transmitted along the ground part of the circuit.

Since the above-described leaking current may be transmitted to the conductor, such as an external case of the portable electronic device, with which a human body can come into contact, a user may feel an unpleasant shock as a result, and when the leaking current is strong, there is a problem that the leaking current may lead to electrocution, which can inflict injury on the user.

Accordingly, a protective element configured to protect the user from the above-described leaking current should be provided on the conductive gasket or the conductive contactor configured to connect the metal housing and the circuit board. Further, when the metal housing is used as an antenna, since decrease of signals occurs and RF signals may not be smoothly transmitted when a capacitance is low, the conductive gasket or the conductive contactor should implement a high capacitance.

As described above, a contactor having various functions for not only simple electric contact but also protecting the user or the circuit in the portable electronic device is required due to use of a conductor, such as a metal case.

However, additional component elements are necessary to implement the various functions, and accordingly, since an additional space should be secured in the circuit board of the portable electronic device, the minimization is negatively influenced.

Accordingly, a method for stacking a contactor and a functional element in the same space on a circuit board without a separate mounting space is required.

SUMMARY OF THE INVENTION

The present invention is directed to providing a clip-type contactor capable of minimizing a space for mounting a functional element to efficiently use a mounting space of a circuit board and a protective apparatus including the same.

The present invention provides a clip-type contactor including a bent-shaped body having an elastic force and configured to come into electric contact with a conductor of an electronic device; an elastic restriction part configured to extend from an upper side of the bent-shaped body to a lower side of the bent-shaped body to restrict movement of the body; and a stacking means disposed at a lower portion of the body to be stacked in the same space as that of a functional element configured to protect a user or an inner circuit on a circuit board.

The stacking means may include a supporter forming an accommodation part to dispose the functional element therein.

The accommodation part may be formed in a "⊏" shape by the supporter.

The accommodation part may be formed in an "E" shape by the supporter.

The accommodation part may be formed in a quadrangular shape by the supporter.

The accommodation part may be formed in the quadrangular shape by the supporter and may have one side of the quadrangular shape formed to extend inward.

The supporter may be separated at a plurality of locations to vertically extend from a lower surface edge of the body.

The stacking means may be coupled to an upper side of the functional element in a forcible insertion-coupling method.

The stacking means may include a coupling part configured to protrude from a lower portion of the body to be coupled to a groove portion of the functional element.

The stacking means may further include a fixing part configured to vertically extend from an end portion of the lower portion of the body in a downward direction to be in surface contact with a side portion of the functional element.

The body may include a contact part configured to come into contact with the conductor, a bent part configured to extend from one side of the contact part and having an elastic force, and a lower surface part configured to extend from one side of the bent part to face the contact part.

The elastic restriction part may extend toward the lower surface part from one side of the contact part, and one end of the elastic restriction part may be in contact with the lower surface part and bent toward the elastic restriction part.

The elastic restriction part may extend toward the bent part in a curved shape from one side of the contact part, and one end of the elastic restriction part may be in contact with the lower surface part.

Meanwhile, the present invention provides a protective apparatus including a circuit board, the clip-type contactor, of which an upper surface comes into contact electrically with a conductor of an electronic device, and a functional element having at least a part mounted on the circuit board to be stacked with the clip-type contactor by the stacking means, wherein the clip-type contactor and the functional element are electrically connected in series.

The circuit board may include a pad and a wire so that the clip-type contactor and the functional element are electrically connected in series.

The functional element may include at least one among an electric shock protection element, a varistor, a suppressor, and a diode.

The conductor may include at least one among an antenna for communication between the electronic device and an external device, a metal case, and a conductive accessory.

According to the present invention, since a stacking means is provided to be doubly stacked with a functional element at the same space on a lower portion of a clip-type contactor, an additional space for mounting two components on a circuit board can be minimized and thus a portable electronic device can be minimized.

Further, since the contactor configured to connect a conductor and the circuit board, and a functional element are doubly stacked on the portable electronic device from which a conductor, such as a metal case, is exposed to the outside, the present invention can prevent an injury, such as an electric shock, from happening to a user due to the conductor and the like, or prevent damage of an inner circuit.

In addition, since an elastic restriction part configured to generate a repulsive force is provided at one side of the clip-type contactor, a repulsive force against a pressure from the elastic restriction part can be generated even when the clip-type contactor is pressed by the conductor, and thus deformation of the clip-type contactor can be prevented.

DETAILED DESCRIPTION OF THE INVENTION

Figure 1:
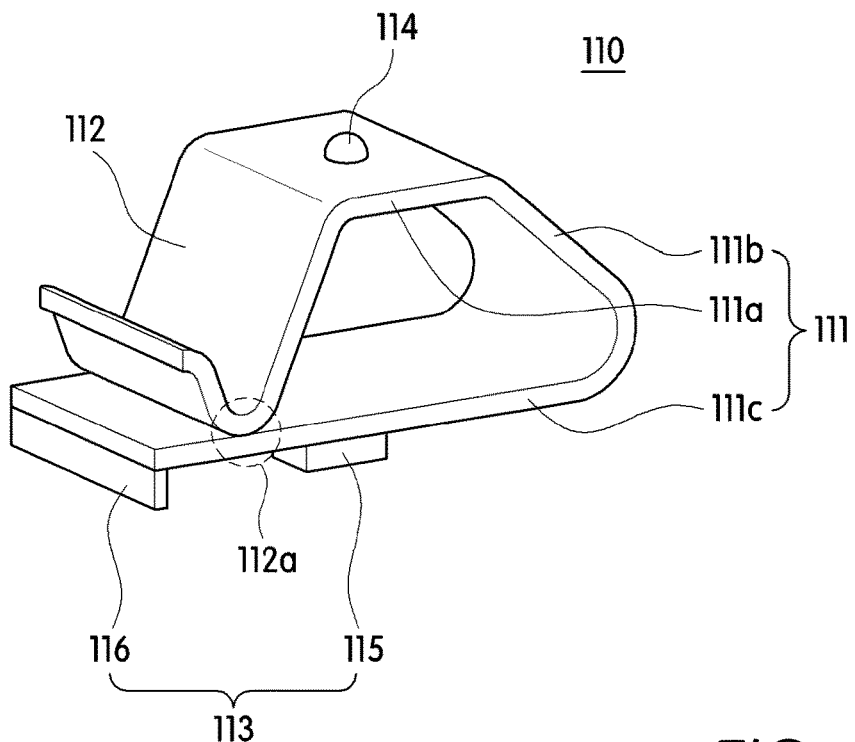
FIG. 1 is a perspective view schematically illustrating a clip-type contactor according to an embodiment of the present invention.

Hereinafter, exemplary embodiments of the present invention will be described in detail with reference to the accompanying drawings which may allow one of ordinary skill in the art to easily perform the present invention. The present invention may be implemented in various forms and is not limited to the following embodiments. Components not related to the description are omitted in the drawings to clearly describe the present invention, and the same reference symbols are used for the same or similar components in the description.

A clip-type contactor 110 according to an embodiment of the present invention is pressed by a pressure for coupling a conductor 12 to a portable electronic device and has an elastic force to be restored to an original state when the conductor 12 is separated from the portable electronic device.

As shown in FIG. 1, the clip-type contactor 110 includes a body 111, an elastic restriction part 112, and a stacking means 113.

The body 111 includes a contact part 111a, a bent part 111b, and a lower surface part 111c. The contact part 111a is in contact with the conductor 12 of the portable electronic device and a contact protrusion 114 which may be electrically connected to the conductor 12 protrudes from an upper side of the contact part 111a.

The bent part 111b is bent from one side of the contact part 111a to extend therefrom and has an elastic force. When the contact part 111a is in contact with the conductor 12 due to the elastic force of the bent part 111b, the contact part 111a is pressed by a pressure of the conductor 12 and subsequently returns to an original state due to the elastic force of the bent part 111b when the contact part 111a is separated from the conductor 12.

The lower surface part 111c may extend from one side of the bent part 111b to face the contact part 111a, and a lower surface of the lower surface part 111c configured to face an upper surface of a functional element 120 may include terminals electrically connected to the functional element 120 or a circuit board 130.

Figure 2:
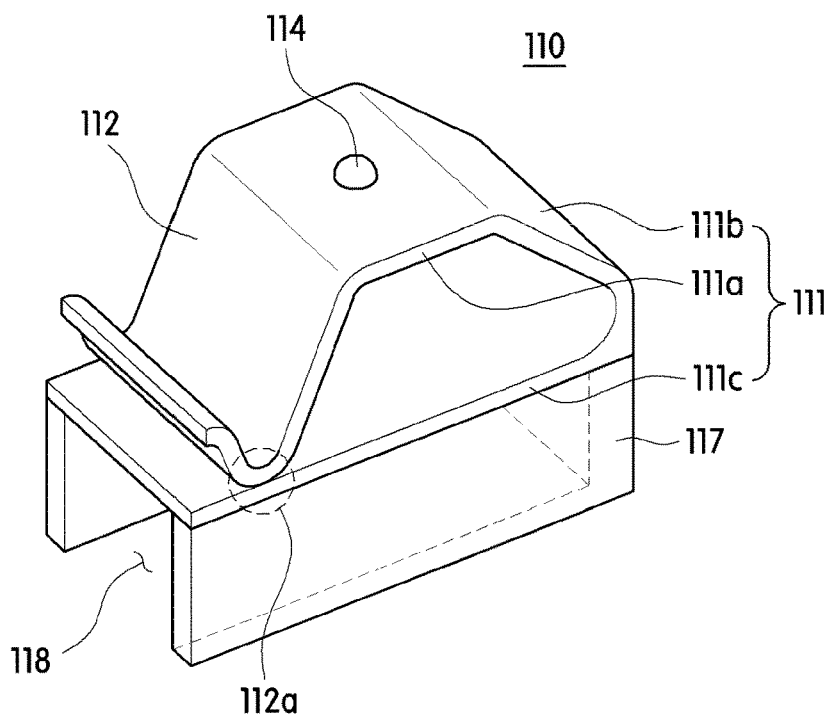
FIG. 2 is a perspective view schematically illustrating another example of a stacking means in the clip-type contactor according to the embodiment of the present invention.

As shown in FIGS. 1 and 2, the elastic restriction part 112 may extend toward the lower surface part 111c from an end of the contact part 111a, and in this case, one portion 112a of the elastic restriction part 112 comes into contact with an upper surface of the lower surface part 111c and is bent toward the elastic restriction part 112.

Figure 3:
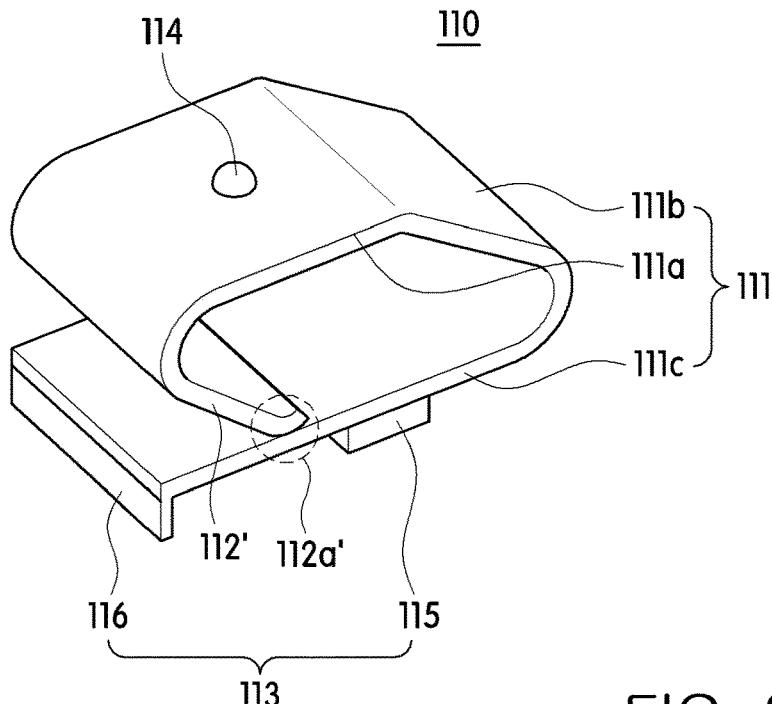
FIG. 3 is a perspective view schematically illustrating another example of the clip-type contactor according to the embodiment of the present invention.
Figure 4:
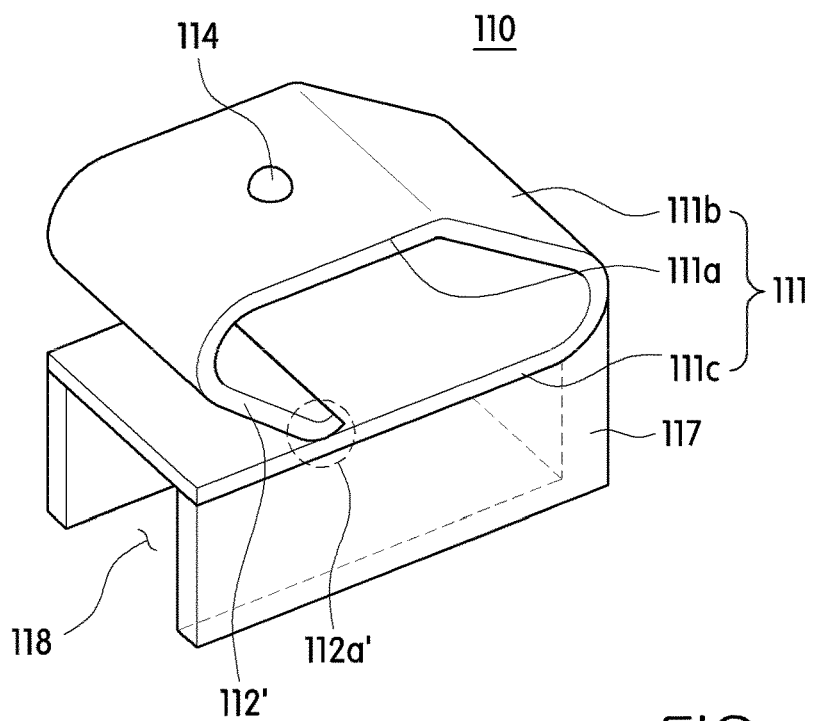
FIG. 4 is a perspective view schematically illustrating another example of the stacking means in another example of the clip-type contactor according to the embodiment of the present invention.

Alternatively, as shown in FIGS. 3 and 4, as another example, the elastic restriction part 112' may be bent toward the lower surface part 111c from the end of the contact part 111a to extend therefrom, and in this case, an end portion 112a' of the elastic restriction part 112' comes into contact with the upper surface of the lower surface part 111c.

Here, the elastic restriction parts 112 and 112' generate a repulsive force against the pressure with which the conductor 12 presses the contact part 111a. That is, when the conductor 12 presses the contact part 111a and thus the contact part 111a is pressed toward the lower surface part 111c, the elastic restriction parts 112 and 112' generate a repulsive force which pushes the contact part 111a toward the conductor 12.

Accordingly, the contact part 111a may prevent distortion or bending of the clip-type contactor 110 after being coupled to the conductor 12.

The stacking means 113 is provided to mount the clip-type contactor 110 with the functional element on the circuit board, and, as shown in FIGS. 1 and 3, may include a coupling part 115 and a fixing part 116.

The coupling part 115 protrudes from a lower portion of the body 111, that is, a lower portion of the lower surface part 111c, and the fixing part 116 is provided to vertically extend in a downward direction from a lower end portion of the body, that is, an end portion of the lower surface part 111c.

In this case, the coupling part 115 is insertion-coupled to the functional element, and the fixing part 116 is in surface contact with a side portion of the functional element 120.

Accordingly, the clip-type contactor 110 may be forcibly insertion-coupled to the functional element by the stacking means 113.

As another example, as shown in FIGS. 2 and 4, the stacking means 113' may include a supporter 117, and an accommodation part 118 having a predetermined space may be formed under the body 111 by the supporter 117.

The accommodation part 118 formed by the supporter 117 is provided to doubly stack the clip-type contactor 110 and the functional element 120 on the circuit board 130, and the functional element 120 is disposed in the accommodation part 118. Detailed description will be described below with reference to FIGS. 8 and 9.

The supporter 117 is disposed to surround an edge of the lower surface part 111c to form the accommodation part 118 opened in a lower direction. That is, the supporter 117 vertically extends from an edge of the lower portion of the lower surface part 111c and becomes sidewalls of the accommodation part 118.

In this case, the accommodation part 118 may have various shapes according to a shape in which the supporter 117 is disposed on the lower portion of the lower surface part 111c.

Figure 5A:
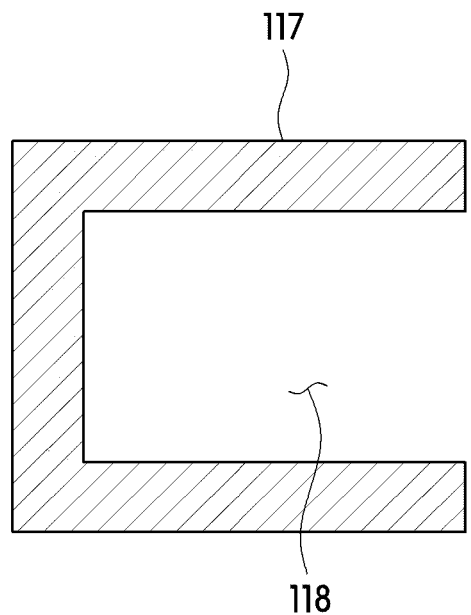
FIGS. 5A to 5C are views illustrating various shapes of an accommodation part in another example of the clip-type contactor according to the embodiment of the present invention, wherein 5A is a view illustrating a case in which the accommodation part has a "⊏" shape, 5B is a view illustrating a case in which the accommodation part has a quadrangular shape, and 5C is a view illustrating a case in which the accommodation part has an "E" shape.

For example, as shown in FIG. 5A, the accommodation part 118 may be provided in a "⊏" shape under the lower surface part 111c by the supporter 117. That is, the sidewalls of the accommodation part 118 may be formed by the supporter 117 configured to vertically extend in a "⊏" shape from the lower portion of the lower surface part 111c.

Figure 5B:
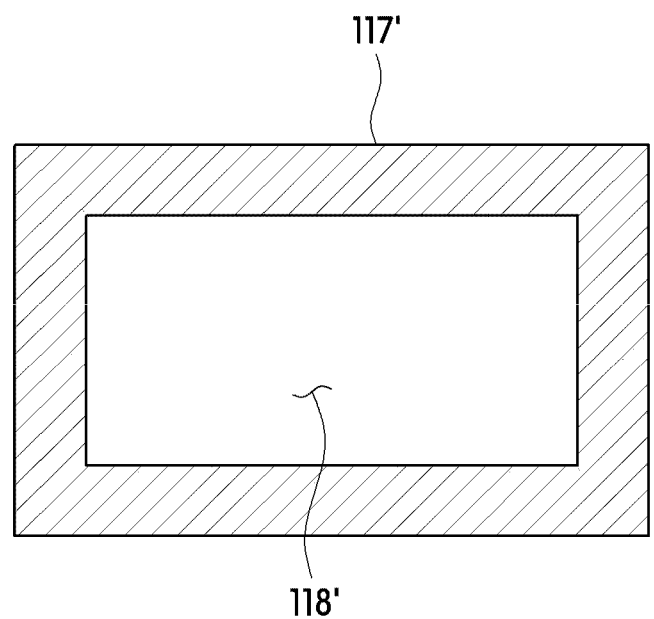

Alternatively, an accommodation part 118' may be provided in a quadrangular shape under the clip-type contactor 110. That is, the clip-type contactor 110 may have sidewalls of the accommodation part 118' formed by a supporter 117' configured to vertically extend in a quadrangular shape from the lower portion of the clip-type contactor 110. (see FIG. 5B)

Figure 5C:
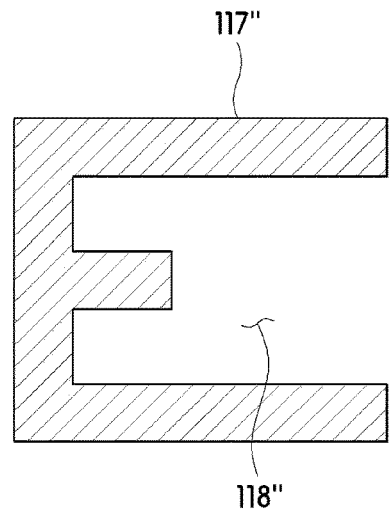

Alternatively, an accommodation part 118" may be provided in an "E" shape under the clip-type contactor 110. That is, the clip-type contactor 110 may have sidewalls of the accommodation part 118" formed by a supporter 117" configured to vertically extend in an "E" shape from the lower portion of the clip-type contactor 110. (see FIG. 5C)

According to the above, as shown in FIGS. 1 to 5, the clip-type contactor 110 may be provided as a conductor having an elastic clip shape which comes into contact with the conductor 12 so as to be capable of carrying current. In this case, in the clip-type contactor 110, the contact part 111a having an elastic force may be pressed toward a circuit board 14 when being pressed by the circuit board 14, and may be restored to an original state, that is, restored to an upper side of a mounting part of the circuit board 14 due to the elastic force of the bent part 111b when the conductor 12 is separated from the portable electronic device.

The clip-type contactor 110 having the above-described configuration may be stacked on the functional element 120 to be mounted on the circuit board, or may be mounted with the functional element 120 on the circuit board.

Figure 6A:
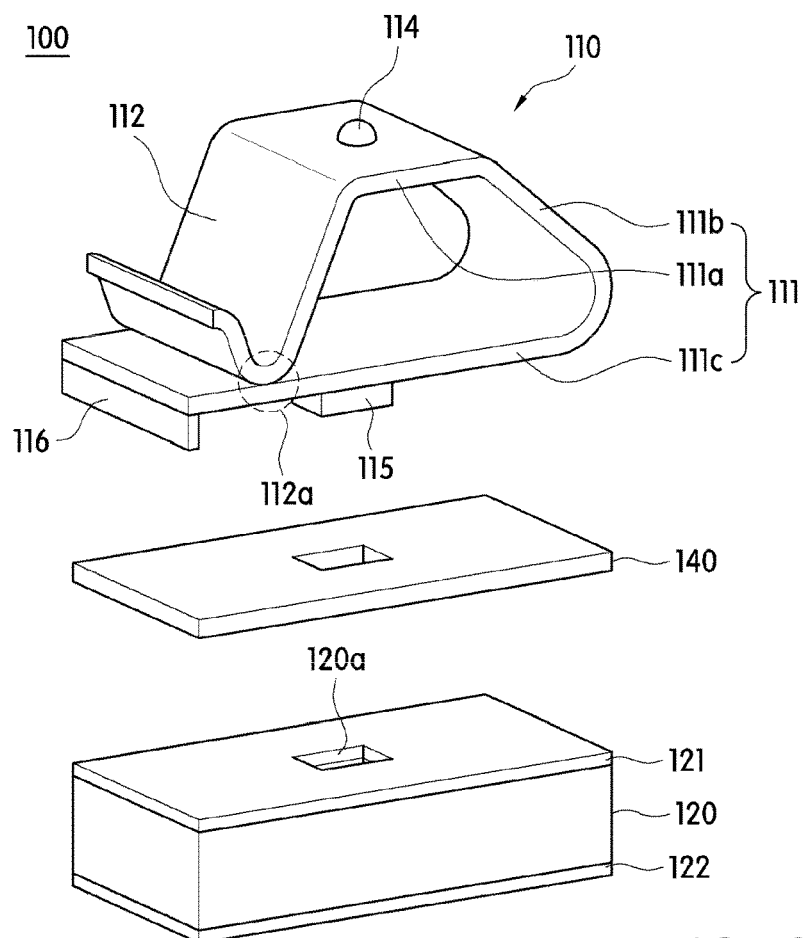
FIGS. 6A and 6B are views illustrating an example of coupling of the clip-type contactor according to the embodiment of the present invention and a functional element, wherein 6A is an exploded perspective view, and 6B is a coupling cross-sectional view.
Figure 6B:
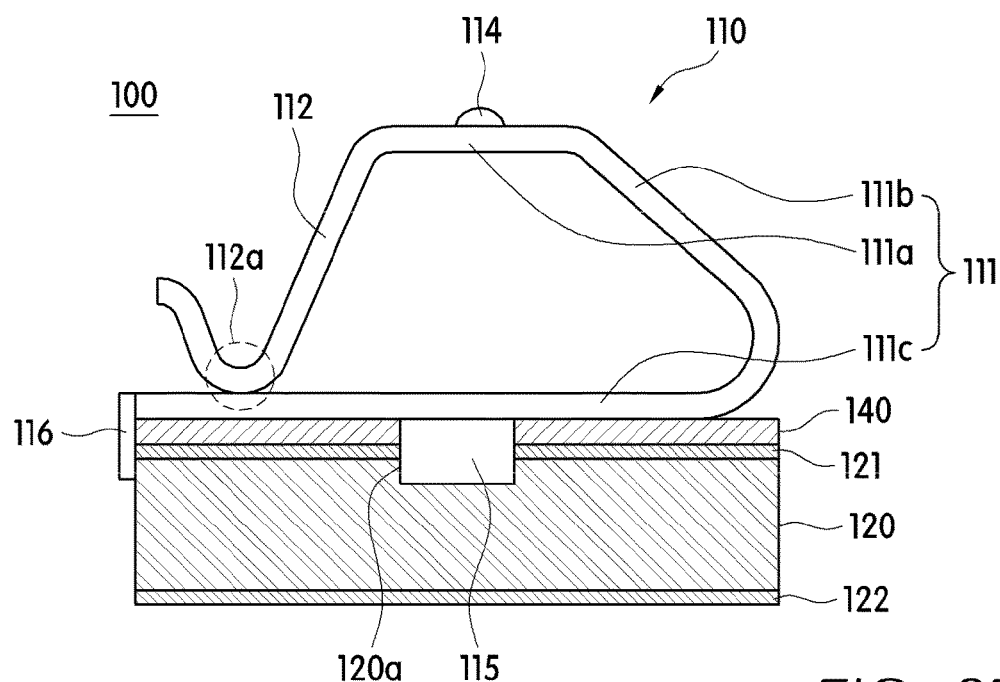
Figure 7:
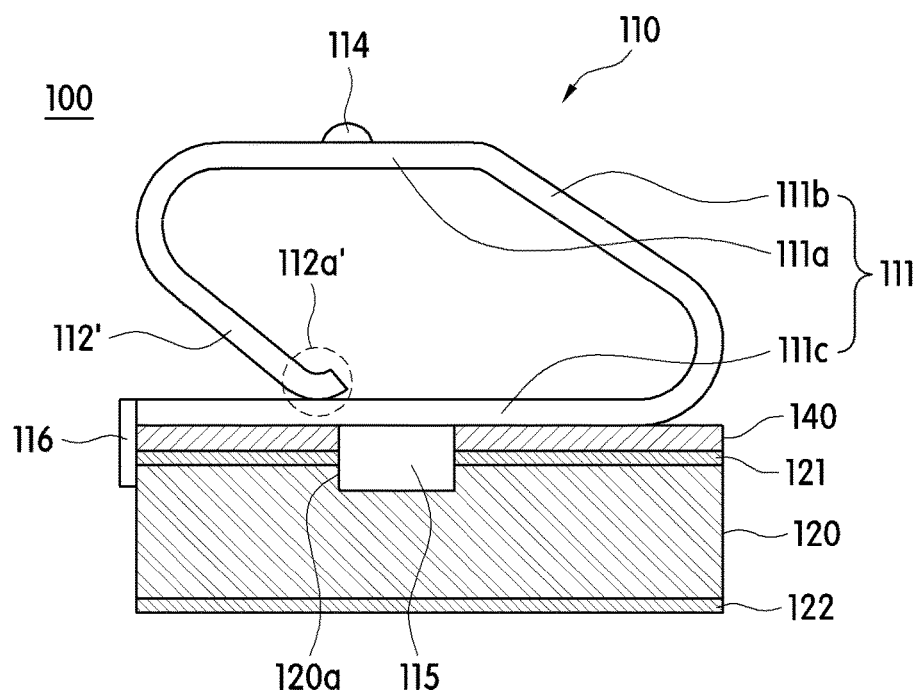
FIG. 7 is a view illustrating an example of coupling of another example of the clip-type contactor according to the embodiment of the present invention and the functional element.

Specifically, as shown in FIGS. 6 and 7, the clip-type contactor 110 having the above-described configuration may be stacked on the functional element 120 in a forcible insertion-coupling method.

Here, the clip-type contactor 110 includes the coupling part 115 and the fixing part 116 to be coupled to the functional element 120, and the coupling part 115 protrudes from the lower portion of the lower surface part 111c to be inserted into a groove portion 120a formed in an upper side of the functional element 120.

Further, the fixing part 116 vertically extends in a downward direction from an end portion of the lower surface part 111c to come into surface contact with a side surface of the functional element 120.

In this case, the clip-type contactor 110 may be stacked on an upper portion of the functional element 120 through a conductive adhesion layer 140. Further, the functional element 120 may have external electrodes 121 and 122 formed on upper and lower portions thereof, respectively, and may be electrically connected to the terminals provided on the lower surface part 111c of the clip-type contactor 110 and the external electrode 121 provided on the upper portion of the functional element 120.

Figure 8A:
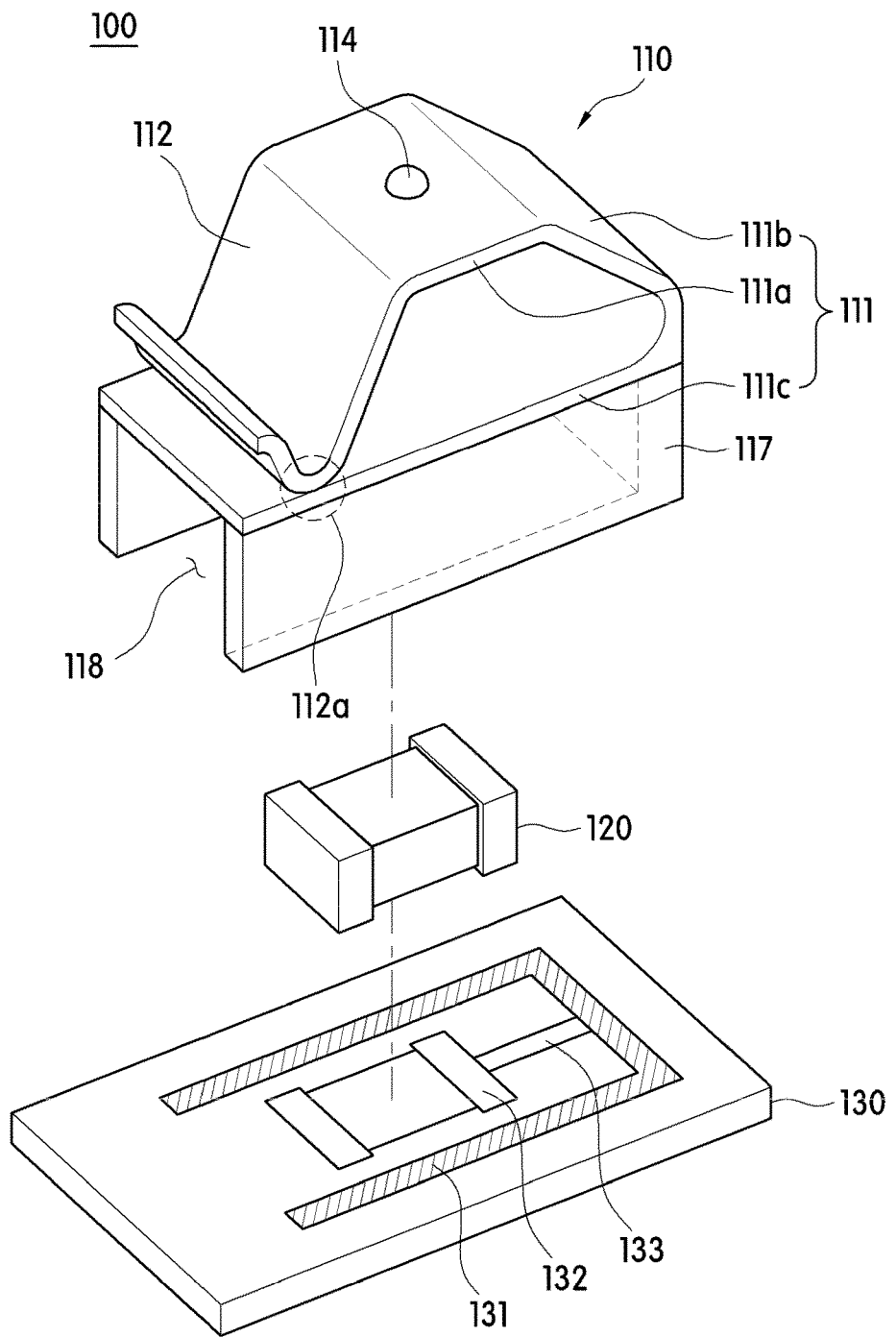
FIGS. 8A and 8B are views illustrating another example of the coupling of the clip-type contactor according to the embodiment of the present invention and the functional element, wherein 8A is an exploded perspective view, and 8B is a coupling cross-sectional view.
Figure 8B:
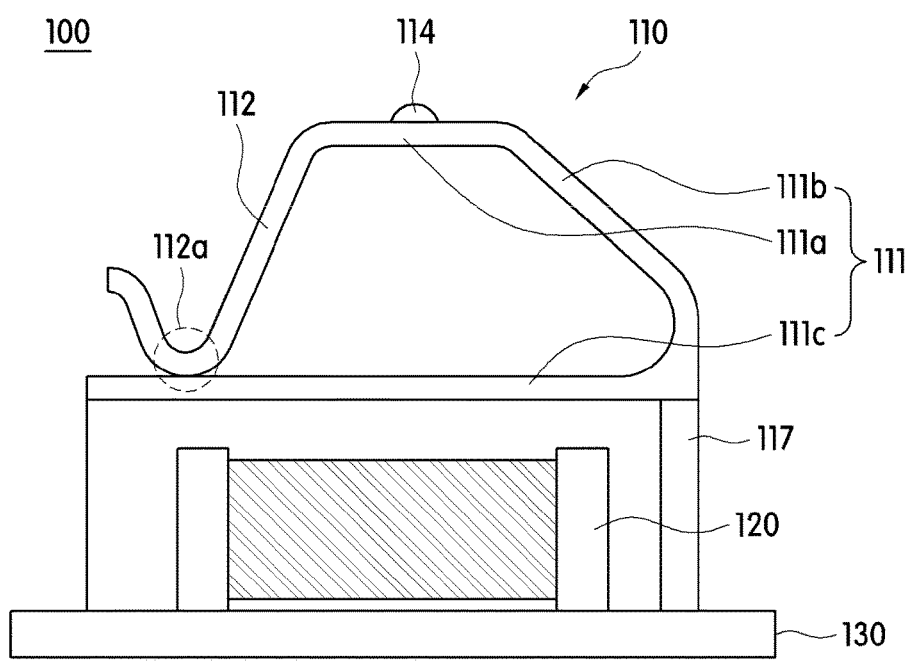
Figure 9:
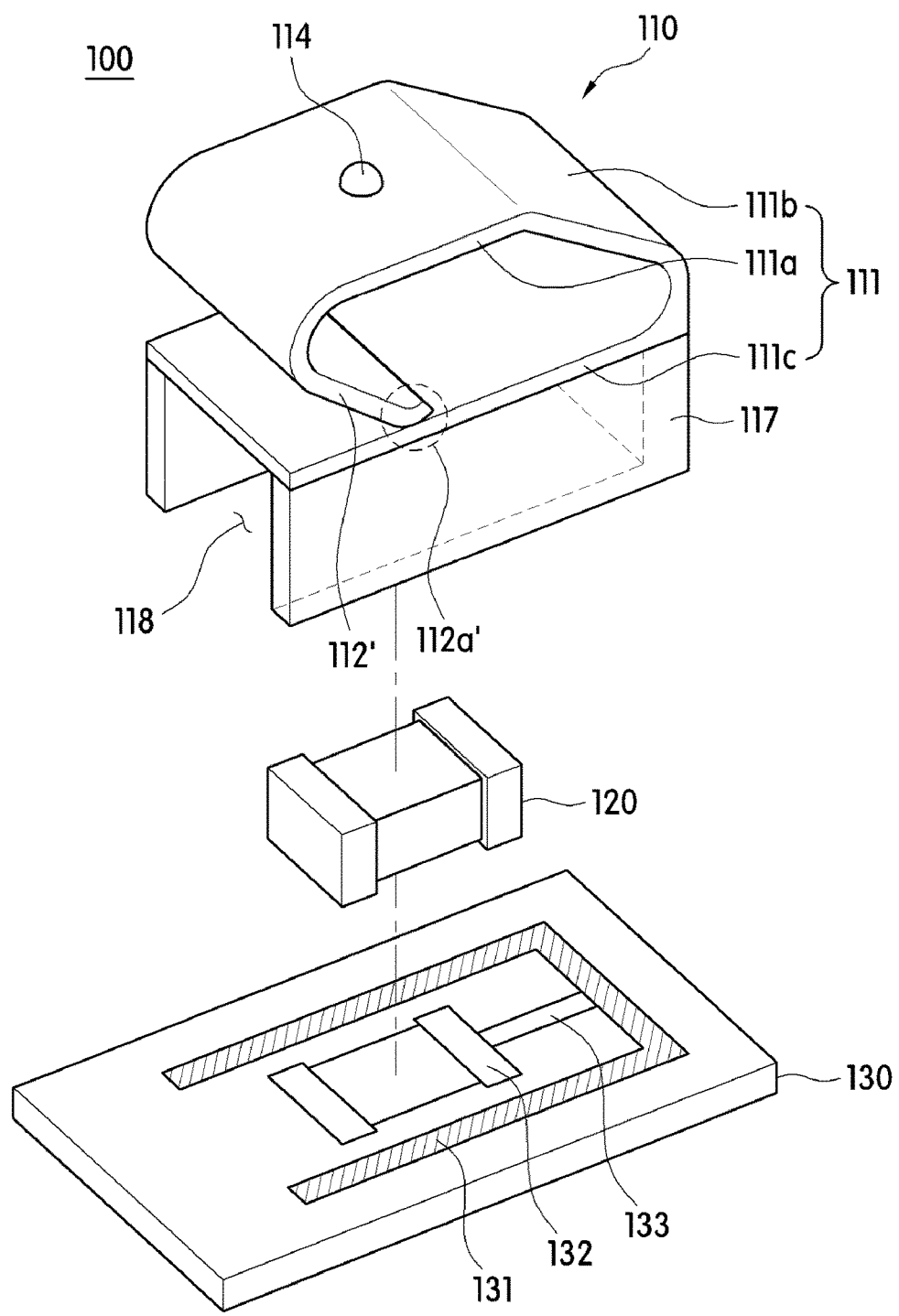
FIG. 9 is a view illustrating another example of the coupling of another example of the clip-type contactor according to the embodiment of the present invention and the functional element.

As shown in FIGS. 8 and 9, as another example of a method of coupling the clip-type contactor 110 and the functional element 120, the clip-type contactor 110 accommodates the functional element 120 to be mounted on the circuit board 130.

Here, the accommodation part 118 in which the functional element 120 is accommodated is provided under the clip-type contactor 110 by the supporter 117, and the functional element 120 is inserted into the accommodation part 118.

In this case, the accommodation part 118 may be provided under the lower surface part 111c in various shapes, and for example, the accommodation part 118 may be provided under the lower surface part 111c in the "⊏" shape. That is, the supporter 117 vertically extends in the "⊏" shape from the lower portion of the lower surface part 111c to form the sidewalls of the accommodation part 118. Further, the functional element 120 is inserted into the accommodation part 118 to be disposed therein.

In addition, since the clip-type contactor 110 and the functional element 120 are not electrically connected, the clip-type contactor 110 and the functional element 120 are electrically connected when being mounted on the circuit board 130.

Accordingly, the circuit board 130 may include a "⊏" shaped contactor pad 131 configured to mount the clip-type contactor 110, a functional element pad 132 configured to mount the functional element 120, and a wire 133 configured to connect the contactor pad 131 and the functional element pad 132.

Further, the functional element 120 is mounted on the functional element pad 132 provided on the circuit board 130, and the clip-type contactor 110 has the functional element 120 inserted into the accommodation part 118 provided in a lower side of the clip-type contactor 110 and is mounted on the contactor pad 131 provided on the circuit board 130. Accordingly, the clip-type contactor 110 and the functional element 120 may be electrically connected.

Meanwhile, the accommodation part 118 may be formed in any shape such as a quadrangular shape, an "E" shape, or the like in addition to the "⊏" shape, in which the functional element 120 may be inserted into a lower side of the clip-type contactor 110, and in this case, a shape of the contactor pad 131 may be formed on the circuit board 130 on the basis of a shape of the accommodation part 118. (see FIGS. 5B and 5C)

Figure 10:
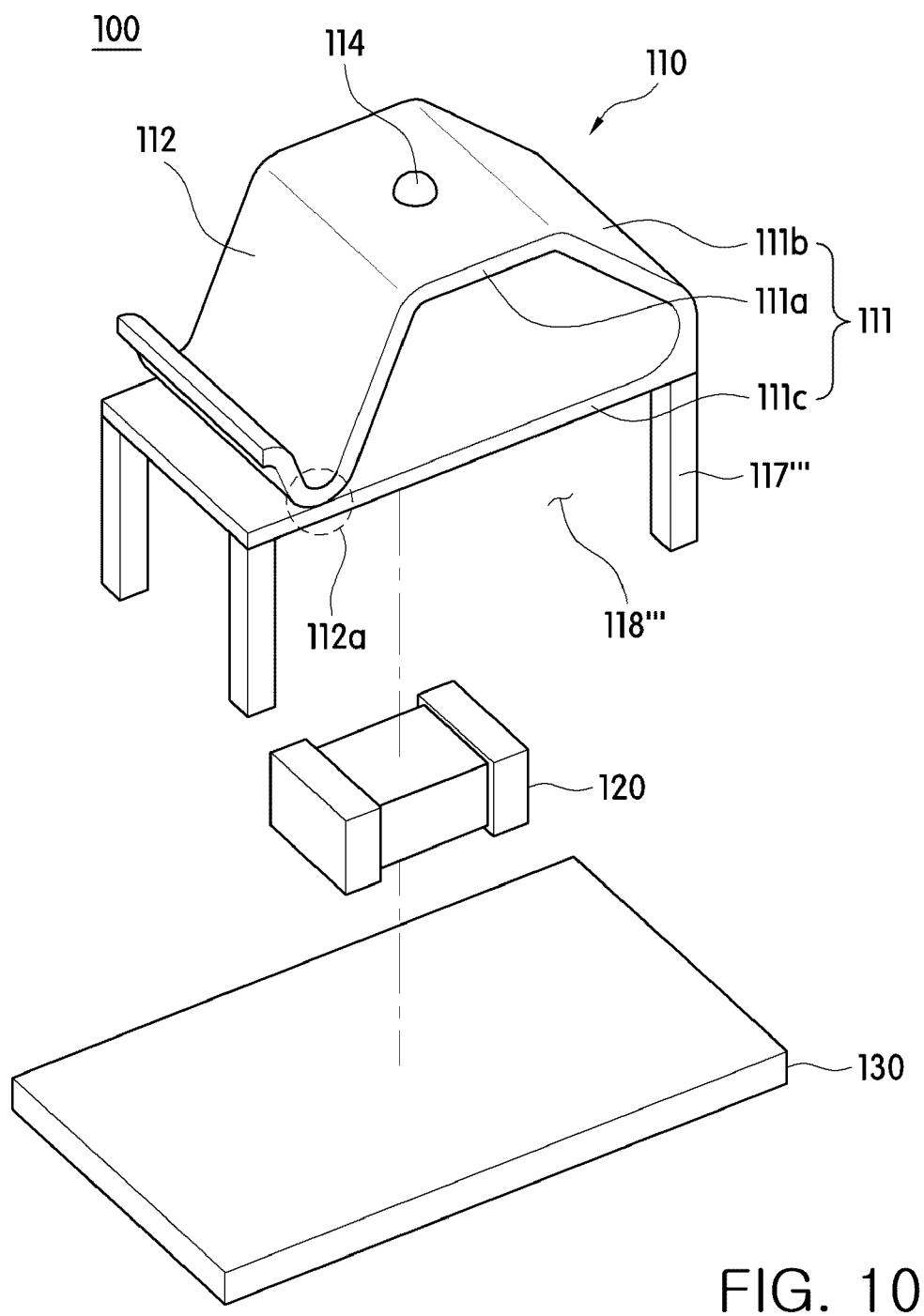
FIG. 10 is an exploded perspective view illustrating still another example of a method of coupling a clip-type contactor according to another embodiment of the present invention and the functional element.
Figure 11:
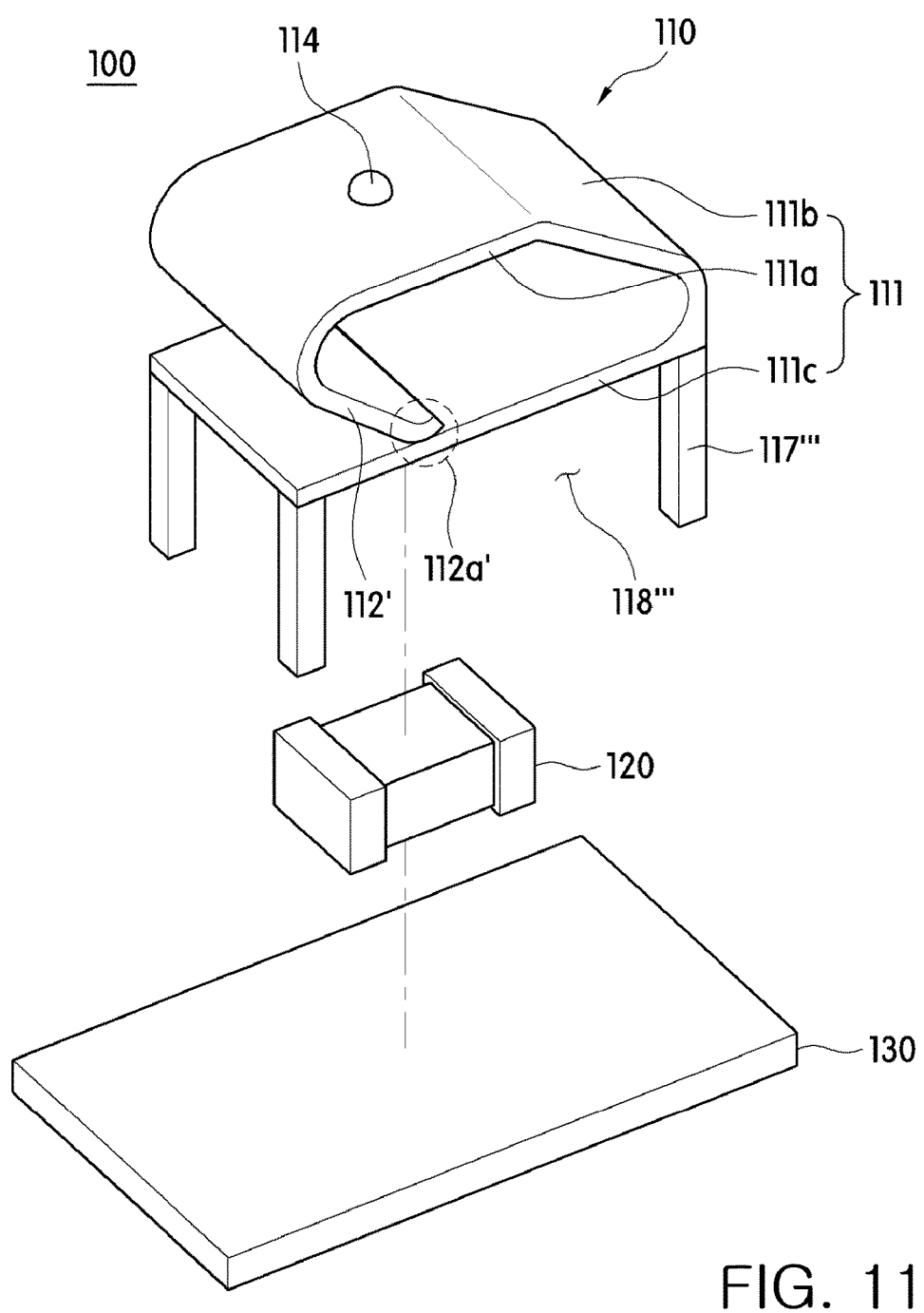
FIG. 11 is an exploded perspective view illustrating still another example of a method of coupling another example of the clip-type contactor according to another embodiment of the present invention and the functional element.

As another modification of an accommodation part 118''', according to FIGS. 10 and 11, the accommodation part 118''' may be formed between a plurality of supporters 117''' configured to vertically extend from a lower portion of the lower surface part 111c. That is, the plurality of supporters 117''' may be provided on an edge of the lower surface part 111c of the clip-type contactor 110.

In this case, the supporters 117''' are provided as four supporters and extend downward from the edge of the lower surface part 111c, the accommodation part 118''' is formed between the four supporters, and the functional element 120 is disposed in the accommodation part 118'''.

Further, although the supporter 117''' is shown and described to be provided as the four supporters, the present invention is not limited thereto. The supporter 117''' may be provided as at least two supporters on the lower surface part to support both sides of the functional element.

Meanwhile, the functional element shown and described in FIGS. 1 to 10 is provided to have a function for protecting a user or an inner circuit and may block leaking current of external power introduced from the ground of the circuit board of the electronic device, allow communication signals introduced from the conductor 12 of the electronic device to pass therethrough, and allow static electricity to pass therethrough without breakdown when the static electricity is introduced from the conductor 12.

Further, the functional element is disclosed to be capable of including, for example, at least one among an electric shock protection element, a varistor, a suppressor, a diode.

Figure 12:
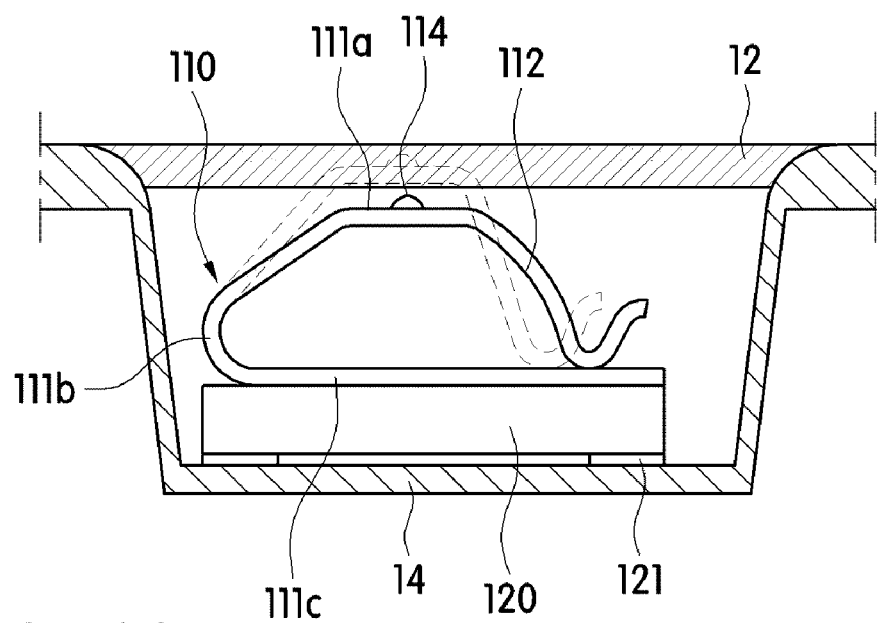
FIG. 12 is a cross-sectional view illustrating an example in which a protective apparatus including the clip-type contactor according to the embodiment of the present invention is applied to a portable electronic device.

As shown in FIG. 12, the protective apparatus 100 including the clip-type contactor 110 having the above-described configuration, and the functional element 120 electrically connects the conductor 12, such as an external metal case, and the circuit board 14 in the portable electronic device.

Here, the portable electronic device may have a shape of a portable electronic device which is portable and easily carried. As an example, the portable electronic device may be a portable terminal such as a smart phone, a cellular phone, or the like, and may also be a smart watch, a digital camera, a DMB, an electronic book, a net book, a tablet PC, a portable computer, etc. Each of the electronic devices may include arbitrary proper electronic components each including antenna structures for communication with an external device. Further, the portable electronic device may be a device using local area network communication such as Wi-Fi and Bluetooth. In this case, the conductor may include at least one among the antennas for the communication between the electronic device and the external device, the metal case, and a conductive accessory.

The clip-type contactor 110 may be pressed by the pressure for coupling the conductor 12 to the portable electronic device and may have the elastic force to be restored to the original state when the conductor 12 is separated from the portable electronic device.

Here, the conductor 12 may be provided to partially or entirely surround a side portion of the portable electronic device and may be an antenna for communication between the portable electronic device and the external device.

When the contact protrusion 114 of the clip-type contactor 110 comes into contact with the conductor 12, the clip-type contactor 110 may be contracted toward the circuit board 130 by the pressure of the conductor 12, and may be restored to the original state by the elastic force thereof when the conductor 12 is separated from the portable electronic device.

Further, the functional element may be coupled to the conductor and the circuit board to block the leaking current of the external power, allow the communication signals introduced from the conductor of the electronic device to pass therethrough, and allow the static electricity to pass therethrough without the breakdown when the static electricity is introduced from the conductor.

Although one embodiment of the present invention is described above, the spirit of the present invention is not limited to the embodiment shown in the description, and although those skilled in the art may provide other embodiments due to addition, change, or removal of the components within the scope of the same spirit of the present invention, such embodiments and the above embodiments are also included in the scope of the spirit of the present invention.

What is claimed is:

1. A clip-type contactor comprising:
a bent-shaped body having an elastic force and configured to come into electric contact with a conductor of an electronic device;
an elastic restriction part configured to extend from an upper side of the bent-shaped body to a lower side of the bent-shaped body to restrict movement of the body;
a supporter configured to form an accommodation part having a space, the space positioned below the lower side of the bent-shaped body and capable of having a functional element positioned therein, the functional element configured to protect a user or an inner circuit and be mounted on a circuit board,
wherein the supporter is mounted on the circuit board and vertically extends from an edge of the lower side of the bent-shaped body and becomes sidewalls of the accommodation part.

2. The clip-type contactor of claim 1, wherein the accommodation part is formed in a "⊏" shape by the supporter.

3. The clip-type contactor of claim 1, wherein the accommodation part is formed in an "E" shape by the supporter.

4. The clip-type contactor of claim 1, wherein the accommodation part is formed in a quadrangular shape by the supporter.

5. The clip-type contactor of claim 4, wherein the accommodation part is formed in the quadrangular shape by the supporter and has one side of the quadrangular shape formed to extend inward.

6. The clip-type contactor of claim 1, wherein the supporter is separated at a plurality of locations to vertically extend from a lower surface edge of the body.

7. A clip-type contactor comprising:
a bent-shaped body having an elastic force and configured to come into electric contact with a conductor of an electronic device;
an elastic restriction part configured to extend from an upper side of the bent-shaped body to a lower side of the bent-shaped body to restrict movement of the body;
a coupling part configured to protrude from a lower portion of the body to be coupled to a groove portion of a functional element, the functional element configured to protect a user or an inner circuit and mounted on a circuit board; and
a fixing part configured to vertically extend from an end portion of the lower portion of the body in a downward direction to be in surface contact with a side portion of the functional element,
wherein the groove portion is formed in an upper side of the functional element, and the coupling part is coupled to the groove portion of the function element.

8. The clip-type contactor of claim 1, wherein the body includes:
a contact part configured to come into contact with the conductor;
a bent part configured to extend from one side of the contact part and having an elastic force; and
a lower surface part configured to extend from one side of the bent part to face the contact part.

9. The clip-type contactor of claim 8, wherein:
the elastic restriction part extends toward the lower surface part from one side of the contact part; and
one end of the elastic restriction part is in contact with the lower surface part and bent toward the elastic restriction part.

10. The clip-type contactor of claim 8, wherein:
the elastic restriction part extends toward the bent part in a curved shape from one side of the contact part; and
one end of the elastic restriction part is in contact with the lower surface part.

11. A protective apparatus comprising:
the circuit board;
the clip-type contactor of claim 1, and of which an upper surface comes into contact electrically with the conductor of the electronic device; and
a functional element having at least a part mounted on the circuit board to be stacked with the clip-type contactor by the stacking means,
wherein the clip-type contactor and the functional element are electrically connected in series.

12. The protective apparatus of claim 11, wherein the circuit board includes a pad and a wire so that the clip-type contactor and the functional element are electrically connected in series.

13. The protective apparatus of claim 11, wherein the functional element includes at least one among an electric shock protection element, a varistor, a suppressor, and a diode.

14. The protective apparatus of claim 11, wherein the conductor includes at least one among an antenna for communication between the electronic device and an external device, a metal case, and a conductive accessory.

* * * * *